United States Patent
Laskaris et al.

(10) Patent No.: US 6,172,588 B1
(45) Date of Patent: Jan. 9, 2001

(54) APPARATUS AND METHOD FOR A SUPERCONDUCTIVE MAGNET WITH POLE PIECE

(75) Inventors: Evangelos Trifon Laskaris, Niskayuna; Michael Anthony Palmo, Ballston Spa, both of NY (US)

(73) Assignee: General Electric Company, Schenectady, NY (US)

( * ) Notice: Under 35 U.S.C. 154(b), the term of this patent shall be extended for 0 days.

(21) Appl. No.: 09/385,407

(22) Filed: Aug. 31, 1999

Related U.S. Application Data

(60) Provisional application No. 60/130,885, filed on Apr. 23, 1999.

(51) Int. Cl.⁷ .................................................. H01F 5/00
(52) U.S. Cl. ........................ 335/299; 335/296; 505/892
(58) Field of Search ..................... 335/216, 296–301; 324/318–321; 505/892–896; 62/51.2

(56) References Cited

U.S. PATENT DOCUMENTS

| | | | |
|---|---|---|---|
| 5,448,214 | 9/1995 | Laskaris | 335/301 |
| 5,563,566 | 10/1996 | Laskaris et al. | 335/216 |
| 5,565,831 | 10/1996 | Dorri et al. | 335/216 |
| 5,570,073 | 10/1996 | Muller | 335/299 |
| 5,574,417 | 11/1996 | Dorri et al. | 335/216 |
| 5,677,630 | 10/1997 | Laskaris et al. | 324/320 |
| 5,801,609 | * 9/1998 | Laskaris et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |
| 6,011,454 | * 1/2000 | Huang et al. | 335/299 |
| 6,011,456 | * 1/2000 | Eckels et al. | 335/300 |

OTHER PUBLICATIONS

Laskaris et al., Application entitled "Open Magnet Having Shielding", filed Nov. 24, 1998, U.S. patent application Ser. No. 09/199,096.

Laskaris et al., Application entitled "Open Magnet With Shielding", filed Nov. 24, 1998, U.S. patent application Ser. No. 09/199,095.

* cited by examiner

*Primary Examiner*—Lincoln Donovan
(74) *Attorney, Agent, or Firm*—Marvin Snyder; Douglas E. Stoner

(57) ABSTRACT

A magnet, such as an open magnetic-resonance-imaging (MRI) magnet) has a first assembly including a superconductive main coil and a magnetizable pole piece which, during magnet operation, has a temperature equal to generally the temperature of the main coil. In one example, a cryogenic-fluid (e.g., liquid helium) dewar encloses the main coil, and the dewar has an interior surface defined in part by a surface portion of the pole piece. A method for providing a homogeneous imaging volume for a magnet includes steps to construct the above-described magnet.

12 Claims, 2 Drawing Sheets

APPARATUS AND METHOD FOR A SUPERCONDUCTIVE MAGNET WITH POLE PIECE

This application claims priority of a Provisional Application entitled "High Field Open Magnet" by Evangelos T. Laskaris et al., Ser. No. 60/130,885 filed Apr. 23, 1999.

BACKGROUND OF THE INVENTION

The present invention relates generally to a superconductive magnet used to generate a uniform magnetic field, and more particularly to such a magnet having a pole piece.

Magnets include resistive and superconductive magnets which are part of a magnetic resonance imaging (MRI) system used in various applications such as medical diagnostics and procedures. Known superconductive magnets include liquid-helium-cooled and cryocooler-cooled superconductive magnets. Typically, the superconductive coil assembly includes a superconductive main coil surrounded by a first thermal shield surrounded by a vacuum vessel. A cryocooler-cooled magnet typically also includes a cryocooler coldhead externally mounted to the vacuum vessel, having its first cold stage in thermal contact with the thermal shield, and having its second cold stage in thermal contact with the superconductive main coil. A liquid-helium-cooled magnet typically also includes a liquid-helium dewar surrounding the superconductive main coil and a second thermal shield which surrounds the first thermal shield which surrounds the liquid-helium dewar.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the magnet's bore where the object to be imaged is placed. A single, tubular-shaped shielding assembly may also be used to prevent the high magnetic field created by and surrounding the main coils from adversely interacting with electronic equipment in the vicinity of the magnet. Such shielding assembly includes several radially-aligned and longitudinally spaced-apart resistive or superconductive shielding coils carrying electric currents of generally equal amperage, but in an opposite direction, to the electric current carried in the main coils and positioned radially outward of the main coils.

Open magnets, including "C" shape magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Known open magnet designs having shielding include those wherein each coil assembly has an open bore and contains a resistive or superconductive shielding coil positioned longitudinally and radially outward from the resistive or superconductive main coil(s). In the case of a superconductive magnet, a large amount of expensive superconductor is needed in the main coil to overcome the magnetic field subtracting effects of the shielding coil. Calculations show that for a 0.75 Tesla magnet, generally 2,300 pounds of superconductor are needed yielding an expensive magnet weighing generally 12,000 pounds. The modest weight makes this a viable magnet design.

It is also known in open magnet designs to place an iron pole piece in the bore of a resistive or superconductive coil assembly which lacks a shielding coil. The iron pole piece enhances the strength of the magnetic field and, by shaping the surface of the pole piece, magnetically shims the magnet improving the homogeneity of the magnetic field. An iron return path is used to connect the two iron pole pieces. It is noted that the iron pole piece also acts to shield the magnet. However, a large amount of iron is needed in the iron pole piece to achieve shielding in strong magnets. In the case of a superconductive magnet, calculations show that for a 0.75 Tesla magnet, only generally 200 pounds of superconductor are needed yielding a magnet weighing over 70,000 pounds which is too heavy to be used in medical facilities such as hospitals. The weight does not make this a viable magnet design.

What is needed is a superconductive magnet design which is physically more compact and which provides greater magnetic field homogeneity within the magnet's imaging volume than known designs.

BRIEF SUMMARY OF THE INVENTION

In a first expression of an embodiment of the invention, a superconductive magnet includes a longitudinally-extending axis and a first assembly having a superconductive main coil and a magnetizable pole piece. The main coil is generally coaxially aligned with the axis, carries a first main electric current in a first direction, and is positioned a first radial distance from the axis. The pole piece is generally coaxially aligned with the axis and is spaced apart from the main coil of said first assembly. Most of the pole piece of said first assembly is disposed radially inward of the main coil of said first assembly, and the pole piece of said first assembly extends from the axis radially outward a distance equal to at least 75 percent of the first radial distance. During operation of the magnet, the pole piece of the first assembly has a temperature equal generally to that of the main coil of the first assembly.

In a second expression of an embodiment of the invention, a superconductive magnet includes a longitudinally-extending axis and includes a first assembly having a superconductive main coil, a magnetizable pole piece, and a cryogenic-fluid dewar. The main coil is generally coaxially aligned with the axis and caries a first main electric current in a first direction. The pole piece is generally coaxially aligned with the axis, is spaced apart from the main coil of the first assembly, and has a surface portion. Most of the pole piece of the first assembly is located radially inward of the main coil of the first assembly. The dewar encloses the main coil of the first assembly and has an interior surface defined in part by the surface portion of the pole piece of the first assembly.

In a third expression of an embodiment of the invention, a superconductive open magnet includes a longitudinally-extending axis and longitudinally spaced-apart first and second assemblies each having a superconductive main coil, a superconductive shielding coil, a magnetizable and generally cylindrical-shaped pole piece, and a cryogenic-fluid dewar. Each main coil is generally coaxially aligned with the axis and carries a first main electric current in the same first direction. Each pole piece is generally coaxially aligned with and intersects the axis, is spaced apart from its associated main coil, and has a surface portion. Most of each pole piece is located radially inward of its associated main coil. Each dewar encloses its associated main and shielding coils and has an interior surface defined in part by the surface portion of its associated pole piece.

In one construction, the open magnet also includes spaced-apart and generally-nonmagnetizable first and second support posts each having a first end structurally attached to the pole piece of the first assembly, each having a second end structurally attached to the pole piece of the second assembly, and each having a surface portion. In this construction, the open magnet further includes first and second dewar conduits each in fluid communication with the dewar of the first assembly and the dewar of the second assembly. Here, the first dewar conduit has an interior surface defined in part by the surface portion of the first support post, and the second dewar conduit has an interior surface defined in part by the surface portion of the second support post.

A first method of the invention includes steps a) and b) and provides a homogeneous magnetic resonance imaging volume for a superconductive magnet having a magnetizable pole piece and a superconductive main coil, wherein the main coil has a critical temperature. Step a) includes cooling the main coil to a temperature equal to or less than the critical temperature. Step b) includes cooling the pole piece to a temperature equal to generally the temperature of the main coil.

A second method of the invention includes steps a) through d) and provides both physical compactness and a homogeneous imaging volume for a superconductive magnet having a magnetizable pole piece and a superconductive main coil. Step a) includes obtaining a generally nonmagnetizable coil support. Step b) includes attaching the coil support to the pole piece. Step c) includes supporting the main coil with the coil support. Step d) includes constructing and positioning a cryogenic-fluid dewar to surround the main coil and to have an interior surface defined in part by a surface portion of the pole piece.

A third method of the invention includes steps a) through j) and provides both physical compactness and a homogeneous imaging volume for a superconductive open magnet having a longitudinally-extending axis and having longitudinally spaced-apart and generally coaxially-aligned first and second assemblies each including a magnetizable and generally cylindrical-shaped pole piece intersecting the axis, a superconductive main coil, and a superconductive shielding coil. Step a) includes obtaining generally nonmagnetizable first coil supports. Step b) includes attaching the first coil supports to the pole piece of the first assembly. Step c) includes supporting the main and shielding coils of the first assembly with the first coil supports. Step d) includes constructing and positioning a cryogenic-fluid dewar to surround the main and shielding coils of the first assembly and to have an interior surface defined in part by a surface portion of the pole piece of the first assembly. Step e) includes obtaining generally nonmagnetizable second coil supports. Step f) includes attaching the second coil supports to the pole piece of the second assembly. Step g) includes supporting the main and shielding coils of the second assembly with the second coil supports. Step h) includes constructing and positioning a cryogenic-fluid dewar to surround the main and shielding coils of the second assembly and to have an interior surface defined in part by a surface portion of the pole piece of the second assembly. Step i) includes attaching a first end of a generally-nonmagnetizable support port to the pole piece of the first assembly and attaches a second end of the support post to the pole piece of the second assembly. Step j) includes constructing and positioning a dewar conduit in fluid communication with the dewar of the first assembly and the dewar of the second assembly, wherein the dewar conduit has an interior surface defined in part by a surface portion of the support post.

Several benefits and advantages are derived from the invention. Making the pole piece a cryogenically-cold pole piece provides greater magnetic field homogeneity within the magnet's imaging volume by eliminating magnetic field inhomogeneities caused by temperature changes of conventional room-temperature pole piece designs caused by changes in room temperature. Making the pole piece a part of the dewar provides physical compactness by eliminating the extra space otherwise required for the cryogenically-cold pole piece of the invention to be completely surrounded by a cryogenic-fluid dewar.

DETAILED DESCRIPTION OF THE INVENTION

Figure 1:
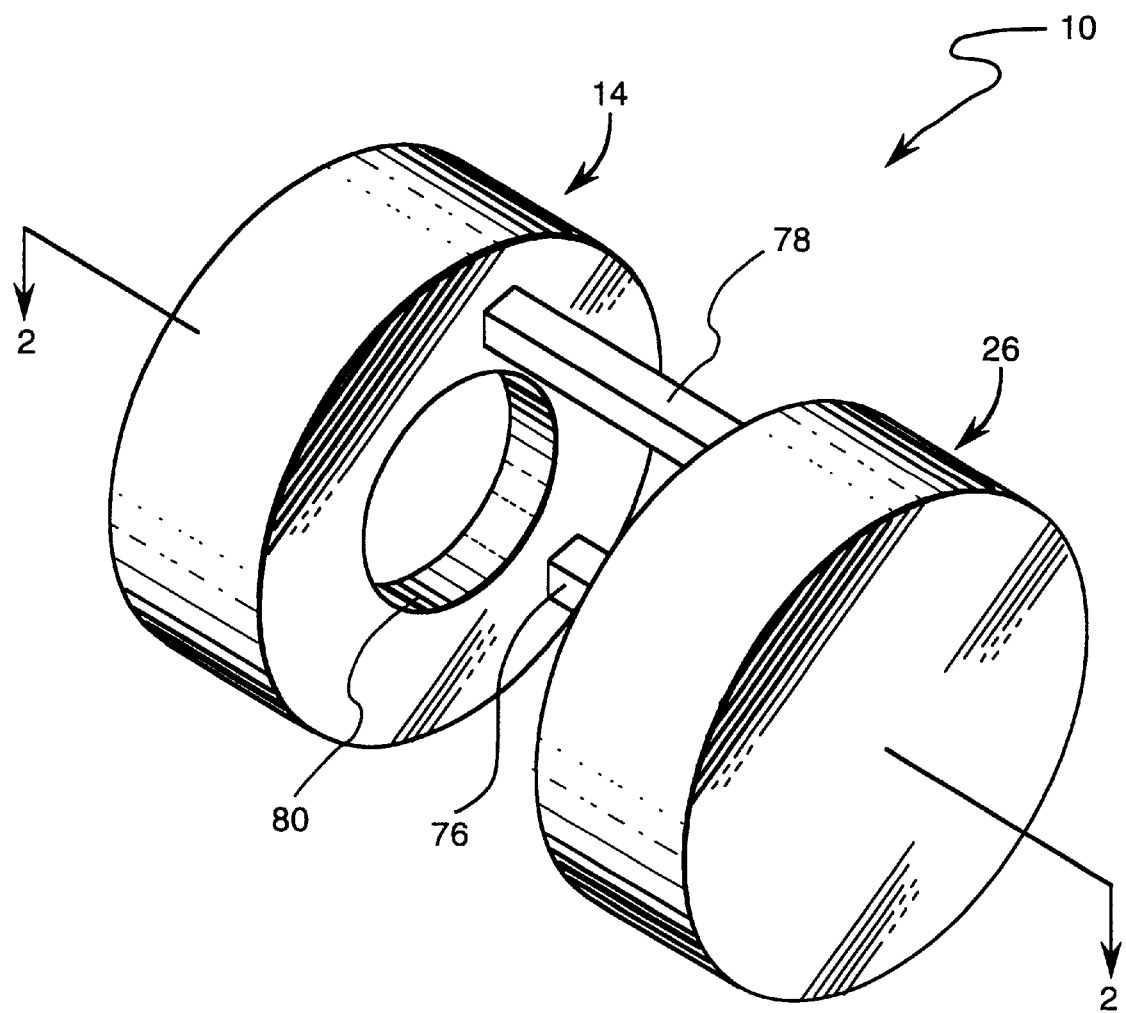
FIG. 1 is a schematic perspective view of an embodiment of the magnet of the invention and FIG. 2 is a schematic cross sectional view of the magnet of FIG. 1 taken along lines 2—2 of FIG. 1.
Figure 2:
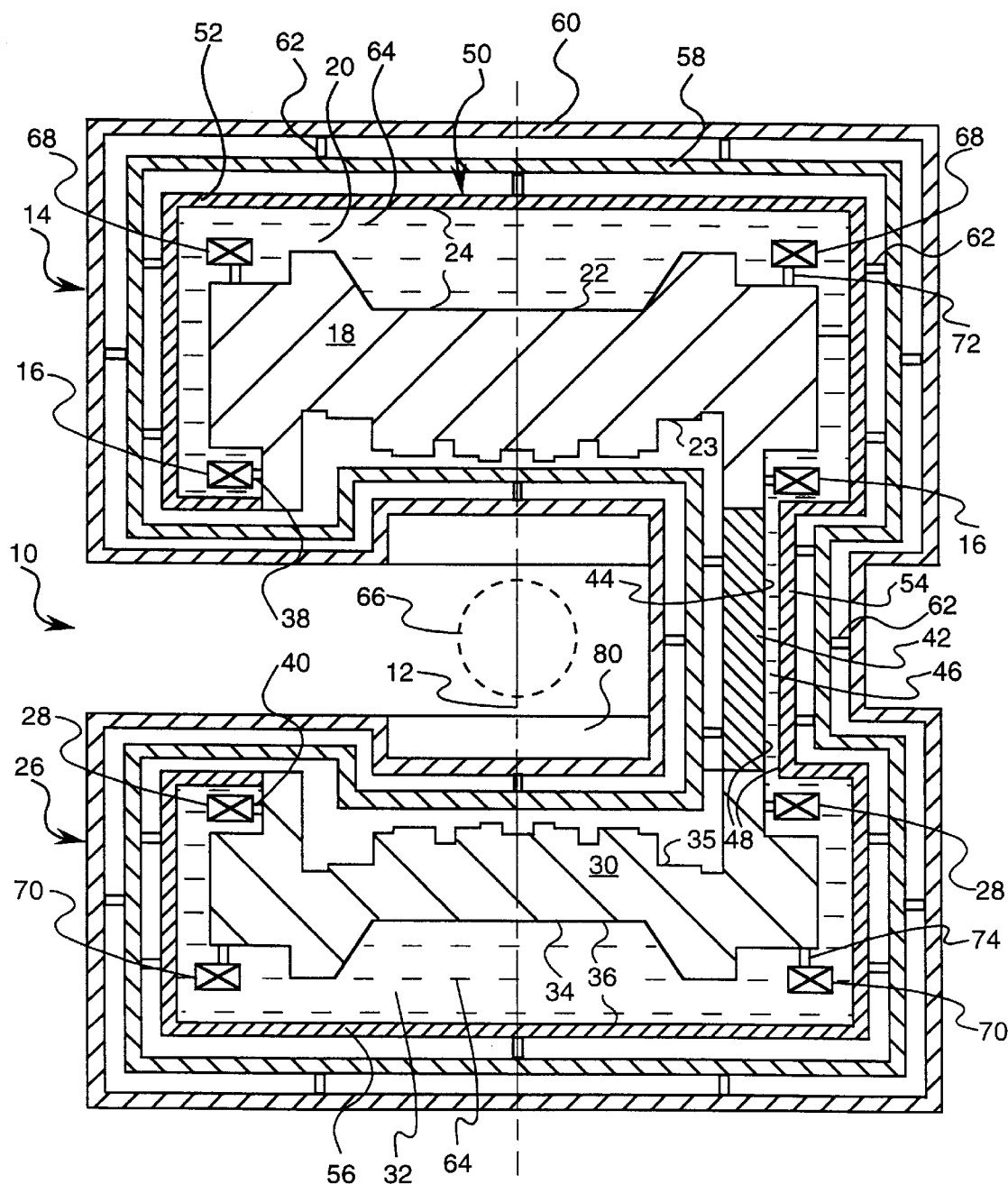

Referring now to the drawings, wherein like numerals represent like elements throughout, FIGS. 1–2 show an embodiment of the magnet 10 of the present invention. In one application, magnet 10 provides the static magnetic field for a magnetic resonance imaging (MRI) system (not shown) used in medical diagnostics. It is noted that in describing the invention, when a magnet is said to include a component such as a coil, a pole piece, or a dewar, etc., it is understood to mean that the magnet includes at least one coil, at least one pole piece, or at least one dewar, etc.

In a first expression of the invention, a superconductive magnet 10 includes a longitudinally-extending axis 12 and a first assembly 14. The first assembly 14 includes a superconductive main coil 16 and a magnetizable pole piece 18. The main coil 16 is generally coaxially aligned with the axis 12, carries a first main electric current in a first direction, and is disposed a first radial distance from the axis 12. The first direction is defined to be either a clockwise or a counter-clockwise circumferential direction about the axis 12 with any slight longitudinal component of current direction being ignored. The pole piece 18 is generally coaxially aligned with the axis 12, and is spaced apart from the main coil 16 of the first assembly 14, Most of the pole piece 18 of the first assembly 14 is disposed radially inward of the main coil 16 of the first assembly 14. The pole piece 18 of the first assembly 14 extends from the axis 12 radially outward a distance equal to at least 75 percent of the first radial distance. During operation of the magnet 10, the pole piece 18 of the first assembly 14 has a temperature equal generally to that of the main coil 16 of the first assembly 14. It is noted that the first assembly 14 may be used alone as a table magnet (not shown) or may be one of two assemblies of an open magnet (as shown in the figures). During operation of the magnet 10, the main coil 16 and the pole piece 18 of the first assembly 14 are cooled by a cryocooler coldhead (not shown), and/or by a cryogenic fluid, or the like.

In a second expression of the invention, a superconductive magnet 10 includes a longitudinally-extending axis 12 and a first assembly 14. The first assembly 14 includes a superconductive main coil 16, a magnetizable pole piece 18, and a cryogenic-fluid dewar 20. The superconductive main coil 16 is generally coaxially aligned with the axis 12 and carries a first main electric current in a first direction. The pole piece 18 is generally coaxially aligned with the axis 12, is spaced apart from the main coil 16, and has a surface portion 22. Most of the pole piece 18 is disposed radially inward of the main coil 16. The dewar 20 encloses the main coil 16 and has an interior surface 24 defined in part by the surface portion 22 of the pole piece 18.

In particular magnet designs, additional superconductive main coils (not shown) may be needed in the first assembly 14 to achieve a high magnetic field strength, within the magnet's imaging volume, without exceeding the critical current density of the superconductor being used in the superconductive coils, as is known to those skilled in the art. An example of a superconductor for the superconductive main coil 16 is niobium-titanium. An example of a material for the pole piece 18 is iron.

In one example, the magnet 10 also includes a second assembly 26 longitudinally spaced apart from the first assembly 14. The second assembly 26 includes a superconductive main coil 28, a magnetizable pole piece 30, and a cryogenic-fluid dewar 32. The superconductive main coil 28 is generally coaxially aligned with the axis 12 and carries a first main electric current in the previously-described first direction. The pole piece 30 is generally coaxially aligned with the axis 12, is spaced apart from the main coil 28, and has a surface portion 34. Most of the pole piece 30 is disposed radially inward of the main coil 28. The dewar 32 encloses the main coil 28 and has an interior surface 36 defined in part by the surface portion 34 of the pole piece 30. In the example shown in FIGS. 1 and 2, the pole piece 18 includes another surface portion 23 which does not help define the interior surface 24 of the dewar 20, and the pole piece 30 includes another surface portion 35 which does not help define the interior surface 36 of the dewar 32.

In one construction, the magnet 10 also includes a generally-nonmagnetizable coil support 38 attached to the pole piece 18 and supporting the main coil 16 of the first assembly 14 and further includes a generally-nonmagnetizable coil support 40 attached to the pole piece 30 and supporting the main coil 28 of the second assembly 26. By "nonmagnetizable" is meant being able to be magnetized no better than nonmagnetic stainless steel. An example of a material for the coil supports 38 and 40 is nonmagnetic stainless steel or fiberglass.

In one magnet design, the magnet 10 also includes a generally-nonmagnetizable (first) support post 42 having a first end structurally attached (e.g., welded) to the pole piece 18 of the first assembly 14, having a second end structurally attached (e.g., welded) to the pole piece 30 of the second assembly 26, and having a surface portion 44. An example of a material for the (first) support post 42 is nonmagnetic stainless steel. In this design, the magnet 10 further includes a (first) dewar conduit 46 in fluid communication with the dewar 20 of the first assembly 14 and the dewar 32 of the second assembly 26. The (first) dewar conduit 46 has an interior surface 48 defined in part by the surface portion 44 of the (first) support post 42. Here, a plate assembly 50 has an interior surface including a first portion 52 defining in part the interior surface of the dewar 20 of the first assembly 14, a second portion 54 defining in part the interior surface of the dewar 32 of the second assembly 26, and a third portion 56 defining in part the interior surface of the (first) dewar conduit 46. In this example, the magnet 10 additionally includes a thermal shield 58 and a vacuum vessel 60.

The thermal shield 58 is spaced apart from and generally encloses the pole piece 18 and 30 and the dewar 20 and 32 of the first and second assemblies 14 and 26, the (first) support post 42, and the (first) dewar conduit 46. The vacuum vessel 60 is spaced apart from and hermetically encloses the thermal shield 58. An example of a material for the plate assembly 50, the thermal shield 58, and the vacuum vessel 60 is nonmagnetic stainless steel. It is noted that, in this example, the previously-mentioned "spacing apart" is accomplished by using conventional spacers 62.

In operation, the magnet 10 would include cryogenic fluid 64 disposed in the dewar 20 and 32 of the first and second assemblies 14 and 26 and in the (first) dewar conduit 46. An example of a cryogenic fluid is liquid helium. A cryocooler coldhead (not shown) may be used to recondense evaporated liquid helium by having the first stage of the coldhead be in contact with the thermal shield 58 and by having the second stage of the coldhead penetrate into the dewar void volume near the highest point of a dewar 20 and 32 In another embodiment (not shown) of the magnet of the invention, the first and second assemblies 14 and 26 each would have a self-contained dewar, thermal shield, and vacuum vessel wherein support posts would interconnect the vacuum vessels or wherein the two assemblies 14 and 26 would be supported in spaced-apart relationship by a "C"-shaped arm, by being bolted to a floor and/or walls, or by other means. In the embodiment not shown, the cryogenic fluid 64 would be disposed only in the dewar 20 and 32 of the first and second assemblies 14 and 26 since there would be no (first) dewar conduit 46. In the embodiment shown in FIGS. 1 and 2, the magnet 10 also includes a magnetic resonance imaging volume 66 having a center located generally on the axis 12 longitudinally equidistant between the first and second assemblies 14 and 26. One shape of the imaging volume 66 is a sphere. It is noted that typically the second assembly 26 is a general mirror image of the first assembly 14 about a plane (not sown) which is perpendicular to the axis 12 and which is disposed generally equidistant between the first and second assemblies 14 and 26.

In a third expression of the invention, a superconductive open magnet 10 includes a longitudinally-extending axis 12, a first assembly 14, and a second assembly 26 longitudinally spaced apart from the first assembly 14. The first assembly 14 includes a superconductive main coil 16, a superconductive shielding coil 68, a magnetizable and generally cylindrical-shaped pole piece 18, and a cryogenic-fluid dewar 20. The superconductive main coil 16 is generally coaxially aligned with the axis 12 and carries a first main electric current in a first direction. The superconductive shielding coil 68 is generally coaxially aligned with the axis 12, is disposed longitudinally outward from the main coil 16, and carries a first shielding electric current in an opposite direction to the previously-described first direction. The pole piece 18 is generally coaxially aligned with and intersects the axis 12, is spaced apart from the main and shielding coils 16 and 68, and has a surface portion 22. Most of the pole piece 18 is disposed longitudinally between and radially inward of the main and shielding coils 16 and 68. The dewar 20 encloses the main and shielding coils 16 and 68 and has an interior surface 24 defined in part by the surface portion 22 of the pole piece 18. The second assembly 26 includes a superconductive main coil 28, a superconductive shielding coil 70, a magnetizable and generally cylindrical-shaped pole piece 30, and a cryogenic-fluid dewar 32. The superconductive main coil 28 is generally coaxially aligned with the axis 12 and carries a second main electric current in the previously-described first direction. The superconductive shielding coil 70 is generally coaxially aligned with the axis 12, is disposed longitudinally outward from the main coil 28, and carries a second shielding electric current in the previously described opposite direction. The pole piece 30 is generally coaxially aligned with and intersects the axis 12, is spaced apart from the main and shielding coils 28 and 70, and has a surface portion 34. Most of the pole piece 30 is disposed longitudinally between and radially inward of the main and shielding coils 28 and 70. The dewar 32 encloses the main and shielding coils 28 and 70 and has an interior surface 36 defined in part by the surface portion 34 of the pole piece 30.

In one construction, the open magnet 10 also includes generally-nonmagnetizable coil supports 38 and 72 attached to the pole piece 18 and supporting the main and shielding coils 16 and 68 of the first assembly 14 and further includes generally-nonmagnetizable coil supports 40 and 74 attached to the pole piece 30 and supporting the main and shielding coils 28 and 70 of the second assembly 26. In one magnet design, the open magnet 10 also includes generally-nonmagnetizable first 42 and second (not shown but identical with the first 42) support posts each having a first end structurally attached to the pole piece 18 of the first assembly 14, each having a second end structurally attached to the pole piece 30 of the second assembly 26, and each having a surface portion 44. In this design, the open magnet 10 further includes first 46 and second (not shown but identical with the first 46) dewar conduits each in fluid communication with the dewar 20 of the first assembly 14 and the dewar 32 of the second assembly 26. The first dewar conduit 46 has an interior surface 48 defined in part by the surface portion 44 of the first support post 42, and the second dewar conduit has an interior surface defined in part by the surface portion of the second support post. In this example, the open magnet 10 additionally includes a thermal shield 58 and a vacuum vessel 60. The thermal shield 58 is spaced apart from and generally encloses the pole piece 18 and 30 and the dewar 20 and 32 of the first and second assemblies 14 and 26, the first 42 and second support posts, and the first 46 and second dewar conduits. The vacuum vessel 60 is spaced apart from and hermetically encloses the thermal shield 58. It is noted that the first support post 42 and the first dewar conduit 46 are disposed inside a first portion 76 of the vacuum vessel 60, that the second support post and the second dewar conduit are disposed inside a second portion 78 of the vacuum vessel, and that such first and second portions 76 and 78 of the vacuum vessel 60 are shown in FIG. 1. In operation, the magnet 10 would include the previously-described cryogenic fluid 64 and magnetic resonance imaging volume (also known as just "imaging volume") 66. In one construction, the first 42 and second support posts (as seen from the enclosing first and second portions 76 and 78 of the vacuum vessel 60 shown in FIG. 1) are angularly spaced apart between generally 110 and 150 degrees about the axis 12 and disposed radially outward from the imaging volume 66. In one example an angular spacing of generally 130 degrees is provided for convenient placement of the patient (not shown) in the imaging volume 66.

In one application, the open magnet 10 has a magnetic field within its imaging volume 66 of generally 1.4 to 1.5 Tesla. In one orientation of the open magnet 10, the first and second portions 76 and 78 of the vacuum vessel 60 are horizontally aligned (as shown in FIG. 1), and the patient would typically be in a standing position within the imaging volume 66. In another orientation (not shown) of the open magnet 10, the first and second portions 76 and 78 of the vacuum vessel 60 are vertically aligned, and the patient would typically be lying on a patient table within the imaging volume 66. It is noted that the pole pieces 18 and 30 provide the main structural support of the magnet 10 including the coils 16, 28, 68, and 70 and the dewars 20 and 32, and that the pole pieces 18 and 30 are shaped (e.g., have ring steps) to provide a more uniform magnetic field within the imaging volume 66. Any further correction of magnetic field inhomogeneities may be accomplished by active shimming, as is within the skill of the artisan. It is further noted that in the example shown in the figures, magnet 10 is designed for each assembly 14 and 26 to have a recess 80 in the vacuum vessel 60 facing the imaging volume 66 for a split pair of flat shielded gradient/RF coils, wherein the pole faces of the pole pieces 18 and 30 are not laminated, as can be appreciated by the artisan.

A first method of the invention includes steps a) and b) and is a method for providing a homogeneous magnetic resonance imaging volume 66 for a superconductive magnet 10 having a magnetizable pole piece 18 and a superconductive main coil 16, wherein the main coil 16 has a critical temperature (i.e., a temperature at which, and below which, superconductivity occurs). Step a) includes cooling the main coil 16 to a temperature equal to or less than the critical temperature. Step b) includes cooling the pole piece 18 to a temperature equal to generally the temperature of the main coil 16. During operation of the magnet 10, the main coil 16 and the pole piece 18 of the first assembly 14 are cooled by a cryocooler coldhead (not shown), and/or by a cryogenic fluid, or the like.

A second method of the invention includes steps a) through d) and is a method for providing both physical compactness and a homogeneous magnetic resonance imaging volume 66 for a superconductive magnet 10 having a magnetizable pole piece 18 and a superconductive main coil 16. Step a) includes obtaining a generally nonmagnetizable coil support 38. Step b) includes attaching the coil support 38 to the pole piece 18. Step c) includes supporting the main coil 16 with the coil support 38. Step d) includes constructing and disposing a cryogenic-fluid dewar 20 to surround the main coil 16 and to have an interior surface 24 defined in part by a surface portion 22 of the pole piece 18.

In one implementation of the method, a step is added to dispose a thermal shield 58 to be spaced apart from and to generally enclose the pole piece 18 and the dewar 20. In this implementation, another step is added to dispose a vacuum vessel 60 to be spaced apart and to hermetically enclose the thermal shield 58. Here, a further step is added to dispose a cryogenic fluid 64 in the dewar 20.

In one application of the method, step d) constructs the dewar 20 such that the surface portion 22 of the pole piece 18 is between generally 40 percent and generally 60 percent of the total surface area of the pole piece 18. In the same or another application, step d) constructs the dewar 20 to have a void volume wherein at least generally sixty percent of the void volume is located longitudinally outward of the pole piece 18.

A third method of the invention includes steps a) through j) and is a method for providing both physical compactness and a homogeneous magnetic resonance imaging volume 66 for a superconductive open magnet 10 having a longitudinally-extending axis 12 and having longitudinally spaced-apart and generally coaxially-aligned first and second assemblies 14 and 26 each including a magnetizable and generally cylindrical-shaped pole piece 18 and 30 intersecting the axis 12, a superconductive main coil 16 and 28, and a superconductive shielding coil 68 and 70. Step a) includes obtaining generally nonmagnetizable first coil supports 38 and 72. Step b) includes attaching the first coil supports 38 and 72 to the pole piece 18 of the first assembly 14. Step c) includes supporting the main and shielding coils 16 and 68 with the first coil supports 38 and 72 of the first assembly 14. Step d) includes constructing and disposing a cryogenic-fluid dewar 20 to surround the main and shielding coils 16 and 68 of the first assembly 14 and to have an interior surface 24 defined in part by a surface portion 22 of the pole piece 18. Step e) includes obtaining generally nonmagnetizable second coil supports 40 and 74. Step f) includes attaching the second coil supports 40 and 74 to the pole piece 30 of the second assembly 26. Step g) includes supporting the main and shielding coils 28 and 70 with the second coil supports 40 and 74 of the second assembly 26. Step h) includes constructing and disposing a cryogenic-fluid dewar 32 to surround the main and shielding coils 28 and 70 of the second assembly 26 and to have an interior surface 36 defined in part by a surface portion 34 of the pole piece 30. Step i) includes attaching a first end of a generally 20 nonmagnetizable (first) support post 42 to the pole piece 18 of the first assembly 14 and attaching a second end of the (first) support post 42 to the pole piece 30 of the second assembly 26. Step j) includes constructing and disposing a (first) dewar conduit 46 in fluid communication with the dewar 20 of the first assembly 14 and the dewar 32 of the second assembly 26 wherein the (first) dewar conduit 46 has an interior surface 48 defined in part by a surface portion 44 of the (first) support post 42.

In one implementation of the method, a step is added to dispose a thermal shield 58 to be spaced apart from and to generally enclose the pole piece 18 and 30 and the dewar 20 and 32 of the first and second assemblies 14 and 26, the (first) support post 42, and the (first) dewar conduit 46. In this implementation, another step is added to dispose a vacuum vessel 60 to be spaced apart and to hermetically enclose the thermal shield 58. Here, a further step is added to dispose a cryogenic fluid 64 in the dewar 20 and 32 of the first and second assemblies 14 and 26 and in the (first) dewar conduit 46.

In one application of the method, step d) constructs the dewar 20 of the first assembly 14 such that the surface portion 22 of the pole piece 18 is between generally 40 percent and generally 60 percent of the total surface area of the pole piece 18, and step h) constructs the dewar 32 of the second assembly 26 such that the surface portion 34 of the pole piece 30 is between generally 40 percent and generally 60 percent of the total surface area of the pole piece 30. In the same or another application, step d) constructs the dewar 20 of the first assembly 14 to have a void volume wherein at least generally sixty percent of the void volume of the dewar 20 is located longitudinally outward of the pole piece 18, and step h) constructs the dewar 32 of the second assembly 26 to have a void volume wherein at least generally sixty percent of the void volume of the dewar 32 is located longitudinally outward of the pole piece 30. In one example, step j) constructs the (first) dewar conduit 46 to have a void volume located entirely radially outward of the (first) support post 42.

Several benefits and advantages are derived from the invention. Making the pole piece a cryogenically-cold pole piece provides greater magnetic field homogeneity within the magnet's imaging volume by eliminating magnetic field inhomogeneities caused by temperature changes of conventional room-temperature pole piece designs caused by changes in room temperature. Making the pole piece a part of the dewar provides physical compactness by eliminating the extra space otherwise required for the cryogenically-cold pole piece of the invention to be completely surrounded by a cryogenic-fluid dewar.

It is noted that those skilled in the art, using computer simulations based on conventional magnetic field analysis techniques, and using the teachings of the present invention, can design a shielded superconductive open magnet 10 of a desired magnetic field strength, a desired level of magnetic field inhomogeneity, and a desired level of shielding (i.e., a desired position of the 5 Gauss stray field from the center of the imaging volume 66 of the superconductive open magnet). The pole piece enhances the strength of the magnetic field so less superconductor is needed in the main coil. The radially-outermost portion of the pole piece provides a partial magnetic flux return for the main coil which reduces the iron needed in the pole piece and which reduces the amount of superconductor needed in the main coil. The radially-outermost portion of the pole piece also magnetically decouples the shielding coil from the main coil so that the magnetic flux lines from the shielding coil are captured by the radially-outermost portion of the pole piece and do not reach the magnetic flux lines from the main coil. Thus, the iron mass of the pole piece does not have to be increased, and the amount of the superconductor in the main coil does not have to be increased, to offset the field subtracting effects of the magnetic flux lines from the shielding coil, since they are blocked by the presence of the radially-outermost portion of the pole piece.

Computer simulations show that a 1.4 Tesla MRI (magnetic resonance imaging) magnet, as shown in the figures and having a 35 centimeter-diameter spherical imaging volume, would weigh about 30,000 pounds and have a 5 Gauss stray field that b extends 4.5 meters vertically and 5.5 meters horizontally from the center of the imaging volume 66. The 5 Gauss stray field can be contained to 2.5 meters vertically and 3.5 meters horizontally by the use of a 12,000 pound room shield. The magnet would fit inside a 180-centimeter cube (i.e., a cube having length=width=height=180 centimeters).

The foregoing description of several expressions of an embodiment of the magnet of the invention and several methods relating thereto have been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A superconductive magnet comprising:
   a) a longitudinally-extending axis; and
   b) a first assembly including:
      (1) a superconductive main coil positioned about said axis and carrying a first main electric current in a first direction, wherein said main coil of said first assembly is disposed a first radial distance from said axis; and
      (2) a liquid cryogen surrounding said superconductive main coil;
      (3) a magnetizable pole piece coaxially aligned with said axis, spaced apart from said main coil of said first assembly, and in direct contract with said liquid cryogen wherein most of said pole piece of said first assembly is disposed radially inward of said main coil toward said axis of said first assembly, wherein said pole piece of said first assembly extends from said axis radially outward away from said axis a distance equal to at least 75 percent of said first radial distance into said cryogen, and wherein during operation of said magnet said pole piece of said first assembly is in direct thermal contact with said liquid cryogen which cools said pole piece and cools said superconductive main coil of said first assembly to superconductive temperatures.

2. A superconductive magnet comprising:
a) a longitudinally-extending axis; and
b) a first assembly including:
  (1) a superconductive main coil positioned about said axis and carrying a first main electric current in a first direction;
  (2) a magnetizable pole piece coaxially aligned with said axis, spaced apart from said main coil of said first assembly, and having a surface portion, wherein most of said pole piece of said first assembly is disposed radially inward of said main coil toward said axis of said first assembly;
  (3) a cryogenic-fluid dewar enclosing said main coil of said first assembly, said dewar having an interior surface defined in part by said surface portion of said pole piece of said first assembly; and
  (4) a cryogenic fluid in said dewar and in thermal contact with said main coil and in direct contact with said magnetizable pole piece for cooling by said cryogenic fluid.

3. The magnet of claim 2, also including:
c) a second assembly longitudinally spaced apart from said first assembly and including:
  (1) a superconductive main coil generally coaxially aligned with said axis and carrying a second main electric current in said first direction;
  (2) a magnetizable pole piece generally coaxially aligned with said axis, spaced apart from said main coil of said second assembly, and having a surface portion, wherein most of said pole piece of said second assembly is disposed radially inward of said main coil of said second assembly; and
  (3) a cryogenic-fluid dewar enclosing said main coil of said second assembly and having an interior surface defined in part by said surface portion of said pole piece of said second assembly.

4. The magnet of claim 3, also including a nonmagnetizable coil support attached to said pole piece of said first assembly and supporting said main coil of said first assembly and further including a nonmagnetizable coil support attached to said pole piece of said second assembly and supporting said main coil of said second assembly.

5. The magnet of claim 3, also including a nonmagnetizable support post having a first end structurally attached to said pole piece of said first assembly, having a second end structurally attached to said pole piece of said second assembly, and having a surface portion.

6. The magnet of claim 5, also including a dewar conduit in fluid communication with said dewar of said first assembly and said dewar of said second assembly, wherein said dewar conduit has an interior surface defined in part by said surface portion of said support post.

7. The magnet of claim 6, also including a thermal shield spaced apart from and generally enclosing said pole piece and said dewar of said first and second assemblies, said support post, and said dewar conduit.

8. The magnet of claim 7, also including a vacuum vessel spaced apart from and hermetically enclosing said thermal shield.

9. The magnet of claim 8, also including a nonmagnetizable coil support attached to said magnetizable pole piece of said first assembly and supporting said main coil of said first assembly and further including a nonmagnetizable coil support attached to said magnetizable pole piece of said second assembly and supporting said main coil of said second assembly.

10. The magnet of claim 9, also including a cryogenic fluid disposed in said dewar of said first and second assemblies and in said dewar conduit.

11. The magnet of claim 3, also including a cryogenic fluid disposed in said dewar of said first and second assemblies.

12. The magnet of claim 3, also including a magnetic resonance imaging volume having a center located generally on said axis longitudinally equidistant between said first and second assemblies.

* * * * *